United States Patent
Shin (10) Patent No.: US 8,913,761 B2
(45) Date of Patent: Dec. 16, 2014

(54) SOUND SOURCE RECORDING APPARATUS AND METHOD ADAPTABLE TO OPERATING ENVIRONMENT

(75) Inventor: Ki Hoon Shin, Seongnam-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 777 days.

(21) Appl. No.: 12/911,315

(22) Filed: Oct. 25, 2010

(65) Prior Publication Data
US 2011/0103617 A1   May 5, 2011

(30) Foreign Application Priority Data
Oct. 30, 2009   (KR) .................. 10-2009-0104638

(51) Int. Cl.
*H03G 3/00*   (2006.01)
*H03G 3/32*   (2006.01)

(52) U.S. Cl.
CPC .................................. *H03G 3/32* (2013.01)
USPC ............... 381/107; 381/57; 381/104; 381/92; 704/233; 704/238

(58) Field of Classification Search
USPC .......... 381/26, 56, 57, 58, 92, 104, 107, 122; 704/201, 225, 231, 233, 236, 238, 244
See application file for complete search history.

(56) References Cited

U.S. PATENT DOCUMENTS

| | | | | |
|---|---|---|---|---|
| 5,870,705 | A * | 2/1999 | McAuliffe et al. | 704/225 |
| 7,747,028 | B2 * | 6/2010 | Saito et al. | 381/107 |
| 8,155,968 | B2 * | 4/2012 | Sugiyama et al. | 704/270 |
| 2003/0065276 | A1 * | 4/2003 | Akita | 600/559 |
| 2007/0038442 | A1 * | 2/2007 | Visser et al. | 704/233 |
| 2010/0004932 | A1 * | 1/2010 | Washio et al. | 704/255 |

OTHER PUBLICATIONS

Kochhar, Ravi. "Effective SPL Computation." Basement Computing. Univ. Of Wisconsin—Madison, Aug. 26, 1992. <http://www.neurophys.wisc.edu/comp/docs/notes/not006.html>.*
"Sound Levels," engineeringpage.com, N.p., Mar. 26, 2009. Web, Sep. 10, 2013, <http://www.engineeringpage.com/technology/noise/levels.html>.*

* cited by examiner

*Primary Examiner* — Joseph Saunders, Jr.
*Assistant Examiner* — James Mooney
(74) *Attorney, Agent, or Firm* — Staas & Halsey LLP (57) ABSTRACT

Disclosed herein is a sound source recording apparatus and method adaptable to an operating environment, which can record a target sound source at a predetermined level without being affected by characteristics of the sound source or ambient noise. A target sound source is separated from a sound source signal received through an array of microphones and a recording sound pressure level and a gain are estimated using a reference sound pressure level and a reference distance for the target sound source, thereby controlling or adjusting the gain of the microphones.

16 Claims, 6 Drawing Sheets

SOUND SOURCE RECORDING APPARATUS AND METHOD ADAPTABLE TO OPERATING ENVIRONMENT

CROSS-REFERENCE TO RELATED APPLICATIONS

This application claims the priority benefit of Korean Patent Application No. 10-2009-0104638, filed on Oct. 30, 2009 in the Korean Intellectual Property Office, the disclosure of which is incorporated herein by reference.

BACKGROUND

1. Field

Embodiments relate to a sound source recording apparatus and method adaptable to an operating environment, which can record a target sound source at a predetermined level without being affected by characteristics of the sound source or ambient noise.

2. Description of the Related Art

Due to development of digital technologies, many portable devices such as digital cameras and camcorders can record sound when capturing moving images. An intelligent robot, such as a home service robot, which supports household affairs, such as cleaning and errands, while residing together with humans in a residence, also conducts tasks given based on voice recognition due to development of home network technologies.

A device equipped with a sound source recording function receives a signal from a sound source through a microphone. The intensity of the received sound source signal varies depending on distance from the sound source (which will also be referred to as "sound source distance"). If the sound source approaches while the gain of the microphone is constant, a clipping phenomenon in which part of the sound of the sound source is removed occurs when the sound source signal is sampled, reducing the rate of sound source recognition.

In one method that may be employed to solve this problem, the gain of the microphone is compensated according to the sound source distance by performing gain control such that, after an optimal gain for each sound source distance is stored, the gain of the microphone is reduced to decrease the level of the sound source signal that is actually recorded if the intensity of the sound source signal received through the microphone is greater than a predetermined level and is raised to increase the level of the sound source signal that is actually recorded if the intensity of the received sound source signal is less than the predetermined level.

In most cases where such a device operates indoors or outdoors, a microphone mounted on the body of the device receives various sound source signals together with the voice of a speaker as a target sound source.

The method to control the gain of the microphone based only on the intensity of the sound source signal received through the microphone is not very effective in an operating environment in which not only noise generated from household appliances, such as TVs, air conditioners, washing machines, and telephones, that are commonly used at home but also various other noise, such as doorbells, outdoor noise, and conversation between family members are present. This is because the gain of the microphone is automatically adjusted due to changes in the level of ambient noise, which temporarily rises or drops in level, such that the level of recorded voice of the speaker may vary even when the speaker speaks at a constant distance from the device.

In addition, the method to control the gain of the microphone simply based on the sound source distance cannot achieve satisfactory results since the characteristics of each sound source may differ even at the same sound source distance, for example, since the volume of voice spoken by each speaker differs depending on the speaker.

SUMMARY

Therefore, it is an aspect to record a target sound source at a predetermined level without being affected by characteristics of the sound source or by ambient noise that occurs indoors or outdoors.

It is another aspect to separate a target sound source from a received sound source signal and to adjust gain of a microphone according to a sound source distance of the target sound source.

Additional aspects will be set forth in part in the description which follows and, in part, will be obvious from the description, or may be learned by practice of the embodiments.

In accordance with one aspect, a sound source recording method adaptable to an operating environment includes separating a target sound source from a sound source signal the target sound source, and recording the target sound source at a sound intensity adjusted according to the gain.

The sound source separation uses one of independent component analysis (ICA) and geometric source separation (GSS) belonging to a blind source separation (BSS) technology.

The gain estimation uses Expression 1:

$$L = L_{ref} \frac{d_{ref}^2}{d^2}$$

$$G = B \frac{1}{L}$$

where L is an estimated recording sound intensity level, $L_{ref}$ is a reference sound intensity level, d is a sound source distance, $d_{ref}$ is a reference distance, G is an estimated gain, and B is a constant. The reference sound intensity level is preset.

The reference sound intensity level is reset to an effective measured sound intensity level obtained according to Expression 2:

$$L_T = \sqrt{E\{x_i[n]^2\}}, \qquad \text{(Expression 2)}$$

where $L_T$ is a measured sound intensity level, $E\{\ \}$ is an expected value or average, and $x_i[n]$ is a sampled value of a sound source signal $x_i$.

In accordance with another aspect, a sound source recording method adaptable to an operating environment includes separating a target sound source from a signal received through an array of microphones, measuring a sound intensity level of the target sound source, comparing the measured sound intensity level with a preset reference sound intensity level, resetting the reference sound intensity level if the measured sound intensity level is different from the reference sound intensity level and estimating a recording sound intensity level and a gain of the microphones using the reset reference sound intensity level, and adjusting gain of the microphones according to the estimated gain and recording the target sound source.

The measured sound intensity level is an effective sound intensity level. If a sound source distance of the target sound source has changed, the recording sound intensity level and the gain of the microphones are re-estimated according to the changed sound source distance.

In accordance with another aspect, a sound source recording method adaptable to an operating environment includes separating a target sound source from a signal received through an array of microphones, measuring a sound source distance and a sound intensity level of the target sound source, initially setting the measured sound intensity level as a reference sound intensity level and initially setting the measured sound source distance as a reference distance, estimating a recording sound intensity level and a gain of the microphones using the initially set reference sound intensity level and reference distance, and adjusting gain of the microphones according to the estimated gain and recording the target sound source.

If a sound source distance of the target sound source has changed, the recording sound intensity level and the gain of the microphones are re-estimated according to the changed sound source distance.

In accordance with another aspect, a sound source recording apparatus adaptable to an operating environment includes a sound source receiver to receive a sound source signal through an array of microphones, a gain controller to adjust gain of the microphones according to a gain control signal to control a sound intensity of the received sound source signal, a distance measurement unit to measure a sound source distance of a target sound source, and a controller to separate the target sound source from the received sound source signal, analyze the separated target sound source to estimate gain of the microphones, re-estimate gain of the microphones if the sound source distance measured by the distance measurement unit has changed, and provide the gain control signal according to the estimated gain of the microphones.

The controller includes a sound source separator to separate a target sound source from the received sound source signal, a measured sound intensity level calculator to calculate a measured sound intensity level of the target sound source, a reference level setter to reset the measured sound intensity level as a reference sound intensity level if the measured sound intensity level calculated by the measured sound intensity level calculator is different from a preset reference sound intensity level, a recording sound intensity level estimator to estimate a recording sound intensity level using the preset reference sound intensity level or the reset reference sound intensity level, and a gain estimator to estimate gain of the microphones using the estimated recording sound intensity level.

The sound source separator performs sound source separation using one of independent component analysis (ICA) and geometric source separation (GSS) belonging to a blind source separation (BSS) method.

The recording sound intensity level estimator and the gain estimator estimate the recording sound intensity level and the gain using Expression 1:

$$L = L_{ref} \frac{d_{ref}^2}{d^2}$$
$$G = B \frac{1}{L}$$

where L is an estimated recording sound intensity level, $L_{ref}$ is a reference sound intensity level, d is a sound source distance, $d_{ref}$ is a reference distance, G is an estimated gain, and B is a constant.

The sound source recording apparatus may further include a signal converter to sample the received sound source signal to convert the same to a digital signal, wherein the measured sound intensity level calculator calculates an effective measured sound intensity level $L_T$ using a sampled signal of the target sound source according to Expression 2:

$$L_T = \sqrt{E\{x_i[n]^2\}},$$ (Expression 2)

where $L_T$ is a measured sound intensity level, $E\{\ \}$ is an expected value or average, and $x_i[n]$ is a sampled value of a sound source signal $x_i$.

The controller estimates a recording sound intensity level using a reference sound intensity level and a reference distance that are initially set respectively to a sound intensity level and a sound source distance measured for the target sound source and estimates gain of the microphones using the estimated recording sound intensity level.

According to the embodiments, it may be possible for a sound source recorder or a moving image capturing device to reproduce a sound source at a constant and uniform intensity and it may also be possible to increase the sound source recognition capabilities of an intelligent robot for a sound source since the sound source is recorded at a predetermined level by adaptively controlling or adjusting the gain of the microphones according to the operating environment.

BRIEF DESCRIPTION OF THE DRAWINGS

These and/or other aspects of the embodiments will become apparent and more readily appreciated from the following description of the embodiments, taken in conjunction with the accompanying drawings of which.

DETAILED DESCRIPTION

Reference will now be made in detail to the embodiments, examples of which are illustrated in the accompanying drawings, wherein like reference numerals refer to like elements throughout.

Figure 1:
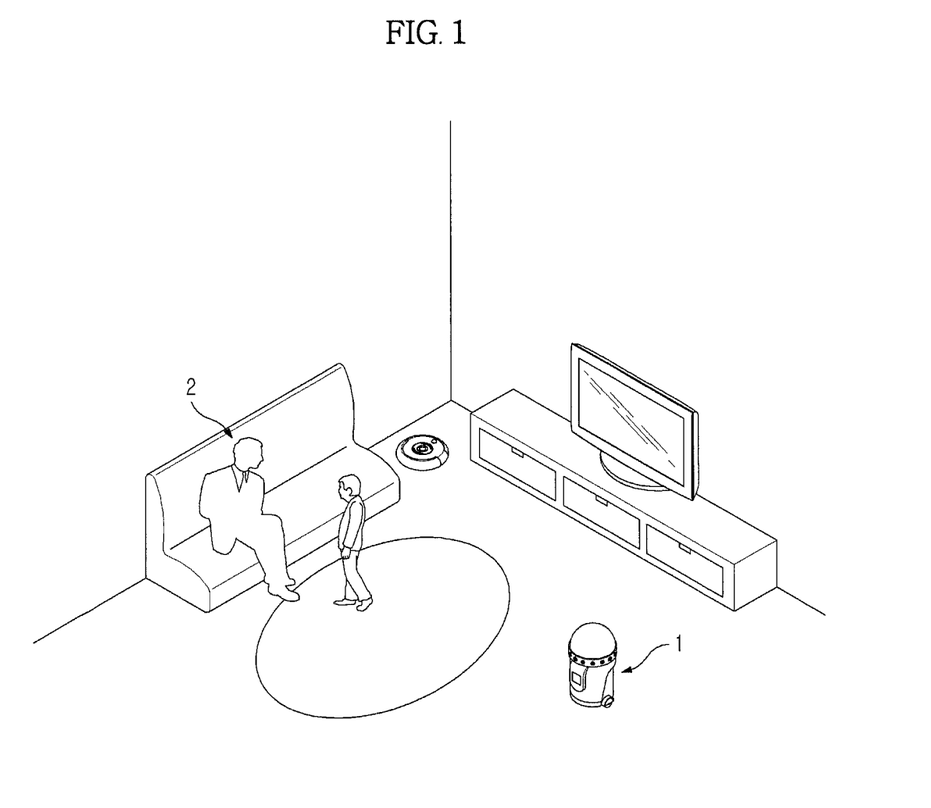
FIG. 1 illustrates an operation to record a sound source using a sound source recording apparatus according to an embodiment.
Figure 2:
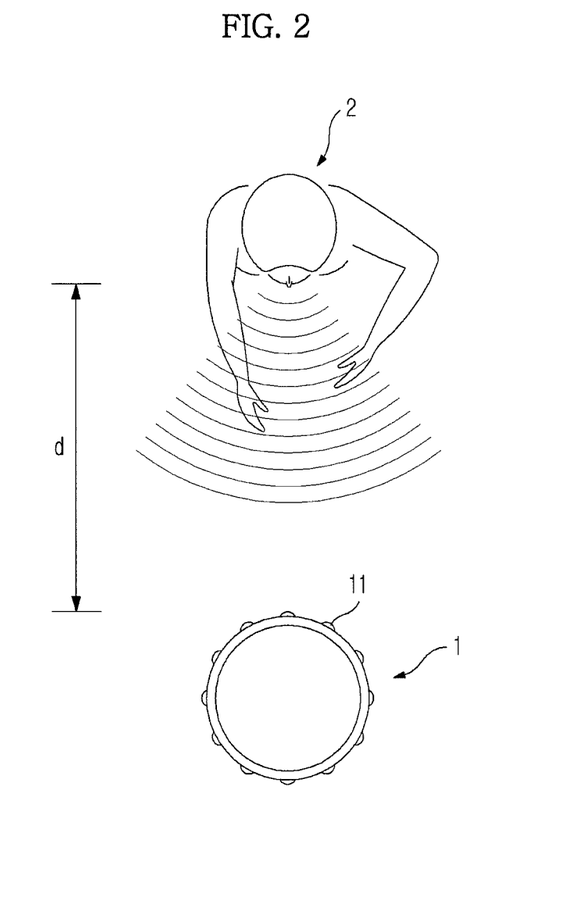
FIG. 2 illustrates a sound source distance, which is the distance of a speaker from a microphone array of the sound source recording apparatus according to the embodiment.

FIG. 1 illustrates an operation to record a sound source using a sound source recording apparatus according to an embodiment and FIG. 2 illustrates a sound source distance, which is the distance of a speaker from a microphone array of the sound source recording apparatus according to the embodiment.

In the case where a sound source recording apparatus 1 is implemented as a home service robot that supports household affairs as shown in FIG. 1, the sound source recording apparatus 1 may record voice that a speaker 2 speaks to issue a task command to the robot. The sound source recording apparatus 1 may be applied not only to the home service robot as in the embodiment but also to a sound source recorder or an image capturing device such as a camcorder or a digital camera.

There is a need to take into consideration the influence of sounds generated from a variety of sound sources including the speaker 2 in most operating environments of the sound source recording apparatus 1 which is used indoors or outdoors. For example, there is a need to exclude a variety of noise in an indoor environment such as a house or an office in which a variety of electronic appliances such as TVs, air conditioners, washing machines, and telephones or office equipment such as printers and fax machines are provided or in an outdoor environment in which wind or vehicle noise is present.

In an embodiment, sound source signals generated from a number of sound sources are received through a microphone array 11 and a target sound source is separated from the received sound source signals.

Here, sound source separation may be performed using one of independent component analysis (ICA) and geometric source separation (GSS) which are part of blind source separation (BSS) technology.

As shown in FIG. 2, microphones of a microphone array 11 are mounted at equal intervals on the outer surface of the body of a robot to which the sound source recording apparatus 1 is applied.

Even though the voice of the speaker 2 is extracted by separating a target sound source from sound source signals received through the microphone array 11, the gain of each microphone is adjusted according to a sound source distance d, which is the distance of the speaker 2 from the microphone array 11, when recording the voice of the speaker 2 as the target sound source since the sound source distance d may vary as the speaker 2 moves. The gain (G) of each microphone is estimated according to the following Expression 1 to perform gain control.

$$L = L_{ref} \frac{d_{ref}^2}{d^2}$$

$$G = B \frac{1}{L}$$

where L is a recording sound intensity level that is estimated to be applied to record a sound source, Lref is a reference sound intensity level, d is a measured sound source distance, dref is a reference distance, G is an estimated gain, and B is a constant. The reference sound intensity level Lref and the reference distance dref may be previously stored.

To record a sound source at a predetermined (or constant) level taking into consideration one characteristic of sound sources such that the volume of sound generated by each person as a sound source located at the same distance varies depending on the person, there is a need to appropriately set a reference sound intensity level for a target sound source signal received by the microphone array 11. That is, even when a reference sound intensity level Lref has been preset through a number of experiments, there is a need to reset and apply a reference sound intensity level Lref when recording a target sound source if the preset reference sound intensity level Lref is not appropriate for the target sound source in an actual operating environment.

To determine whether or not to reset the reference sound intensity level, an effective sound intensity level is measured during a predetermined period and the measured effective level is determined as a measured sound intensity level Lt.

Here, the following Expression 2 is used to determine the measured sound intensity level Lt.

$$L_T = \sqrt{E\{x_i[n]^2\}},$$ (Expression 2)

where $L_T$ is a measured sound intensity level, $E\{\ \}$ is an expected value or average, and $x_i[n]$ is a sampled value of a separated sound source signal $x_i$.

The reference sound intensity level $L_{ref}$ may be reset to a new level according to comparison between the reference sound intensity level $L_{ref}$ and the measured sound intensity level $L_t$ of the separated sound source. For example, the recording sound intensity level L may be estimated according Expression 1 if the reference sound intensity level $L_{ref}$ and the measured sound intensity level $L_t$ of the separated sound source are equal.

A measured sound intensity level $L_t$ obtained according to Expression 2 is reset as a new reference sound intensity level $L_{ref}$ and a sound source distance d measured for the separated sound source is reset as a new reference distance $d_{ref}$. A recording sound intensity level L and a gain G are estimated using the reset reference sound intensity level $L_{ref}$ and the reset reference distance $d_{ref}$ according to Expression 1 and the gain of the microphones is adjusted according to the estimated gain G.

Each time the measured sound pressure distance d is changed due to movement of the speaker 2 during recording of the sound source with the adjusted gain, a recording sound intensity level and a gain are re-estimated using the changed sound pressure distance d according to Expression 1 and the re-estimated recording sound intensity level and gain are applied to control of the gain of the microphones.

Figure 3:
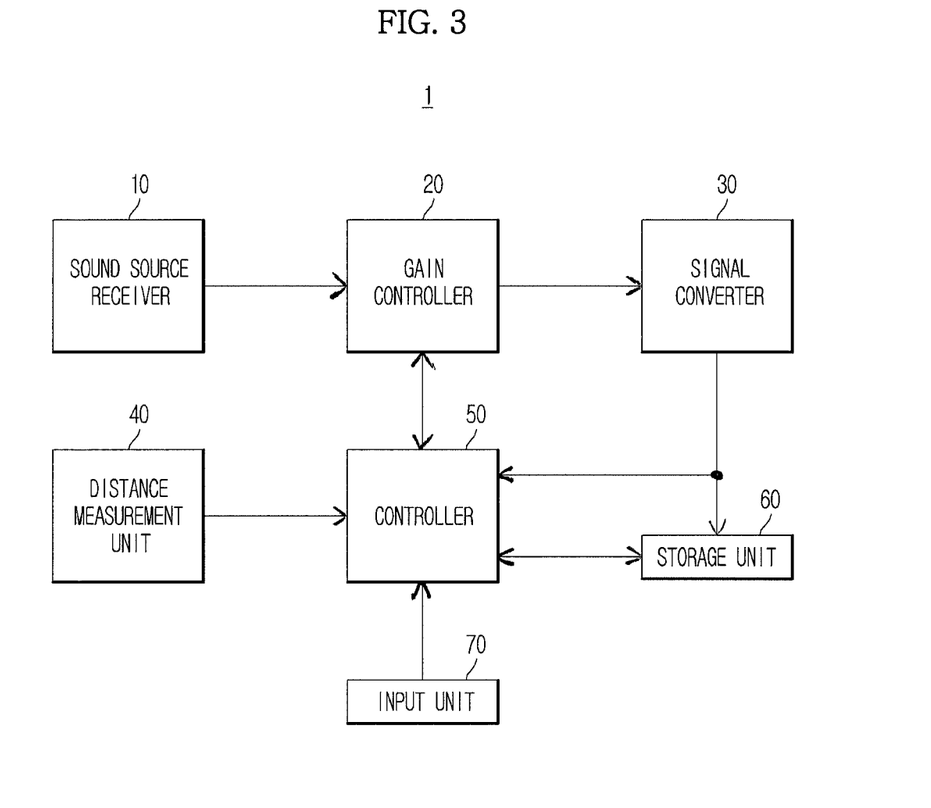
FIG. 3 is a block diagram of a sound source recording apparatus according to an embodiment.
Figure 4:
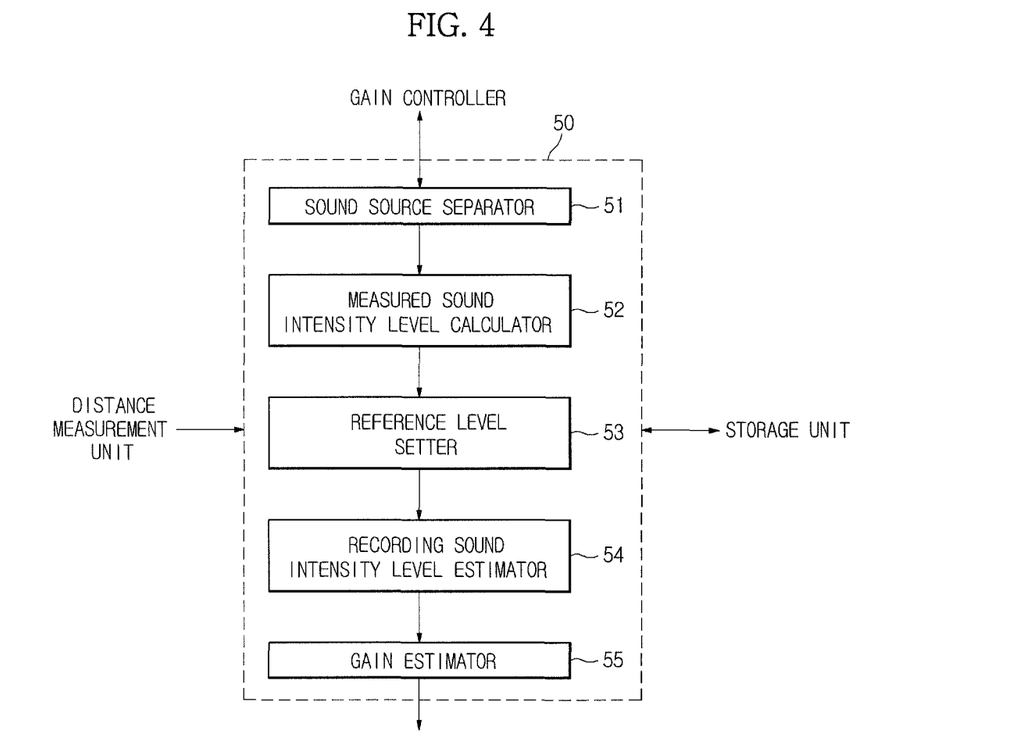
FIG. 4 is a block diagram of a controller of the sound source recording apparatus according to an embodiment.

FIG. 3 is a block diagram of a sound source recording apparatus according to an embodiment and FIG. 4 is a block diagram of a controller of the sound source recording apparatus according to an embodiment.

In the sound source recording apparatus 1, a sound source receiver 10 may include at least one microphone. In an embodiment, the sound source receiver 10 receives a sound source signal generated from at least one sound source using a microphone array 11 in FIG. 2 including microphones mounted at equal intervals on the outer surface of the robot body.

A gain controller 20 may include at least one amplifier that controls the gain of each microphone in response to the sound source signal received by the microphone array 11. The amplifier changes the rate of amplification according to a gain control signal from a controller 50.

A signal converter 30 includes an A/D converter that samples the signal whose gain has been adjusted by the gain controller 20 to convert it to a digital signal and provides the digital sampled signal to the controller 50 and a storage unit 60.

A distance measurement unit 40 measures a sound source distance d, which is the distance of a target sound source from the apparatus. In an embodiment, the distance measurement unit 40 measures the sound source distance d using a Time-Of-Flight (TOF) camera. However, it is noted that the sound source distance may be measured by a different device method than using the TOF camera.

The controller 50 analyzes the sound source signal received through the sound source receiver 10 and provides a gain control signal to the gain controller 20. The controller 50 also performs a task according to voice recognition or a command input through an input unit 70. The input unit 70 may be implemented as a button, a touch screen, or the like for user interfacing.

The storage unit 60 stores data used for sound source recording, which includes a reference sound intensity level and a reference distance.

As shown in FIG. 4, the controller 50 may include a sound source separator 51, a measured sound intensity level calculator 52, a reference level setter 53, a recording sound intensity level estimator 54, and a gain estimator 55.

A sound source signal input to the microphone array 11 in FIG. 2 is converted into a sampled signal through the signal converter 30 and the sampled signal is then provided to the sound source separator 51. The sound source separator 51 separates and extracts a target sound source (i.e., a target sound source signal) from the sampled signal since the sampled signal may include a mixture of not only voice of the speaker 2 as the target sound source but also ambient noise. Here, the sound source separator 51 may use a BSS technology which separates a desired sound source signal from a mixture of a variety of sound source signals without any prepared information regarding the sound source. In an embodiment, the sound source separator 51 uses an ICA algorithm as an example of the BSS technology. The sampled signal of the separated sound source is provided to the measured sound intensity level calculator 52.

The measured sound intensity level calculator 52 calculates an effective measured sound intensity level $L_T$ from the sampled signal of the separated sound source provided from the sound source separator 51 and provides the measured sound intensity level $L_T$ to the reference level setter 53.

The measured sound intensity level $L_T$ is compared with the reference sound intensity level $L_{ref}$ provided from the storage unit 60. The reference level setter 53 sets the reference sound intensity level $L_{ref}$ stored in the storage unit 60 to be used for the calculation of Expression 1 if the compared result is that the measured sound intensity level $L_T$ is equal to the reference sound intensity level $L_{ref}$ stored in the storage unit 60. The reference level setter 53 resets the reference sound intensity level if the measured sound intensity level $L_T$ is different from the reference sound intensity level $L_{ref}$ stored in the storage unit 60. That is, the reference level setter 53 resets the sound intensity level $L_T$ measured for the target sound source as a new reference sound intensity level $L_{ref}$ and stores the new reference sound intensity level $L_{ref}$ in the storage unit 60. In addition, the distance measurement unit 40 resets a distance d measured for the separated sound source as a new reference distance $d_{ref}$ and stores the new reference distance $d_{ref}$ in the storage unit 60.

The controller 50 receives the preset or reset data from the storage unit 60 and estimates a recording sound intensity level L of the target sound source through the recording sound intensity level estimator 54 and estimates the gain G through the gain estimator 55. The controller 50 then provides a gain control signal according to the estimated gain G to the gain controller 20. The gain controller 20 then controls the gain of each microphone according to the gain control signal. As a result, the sound source signal received and amplified by the microphone array 11 is changed to adjust the intensity of sound of the target sound source.

During recording of the sound of the target sound source, the sound source distance d changes as the speaker 2, which is the target sound source, moves. The recording sound intensity level L and the gain G are re-estimated using Expression 1 based on the changed sound source distance d measured by the distance measurement unit 40 and the re-estimated recording sound intensity level L and gain G are applied to appropriately control the intensity of the sound of the target sound source.

According to the embodiment, it is possible to record sound of a target sound source at a predetermined level since the sound signal of the target sound source, the intensity of which is adjusted so as to avoid influence of the sound source characteristics and ambient noise, is stored in the storage unit 60.

Figure 5:
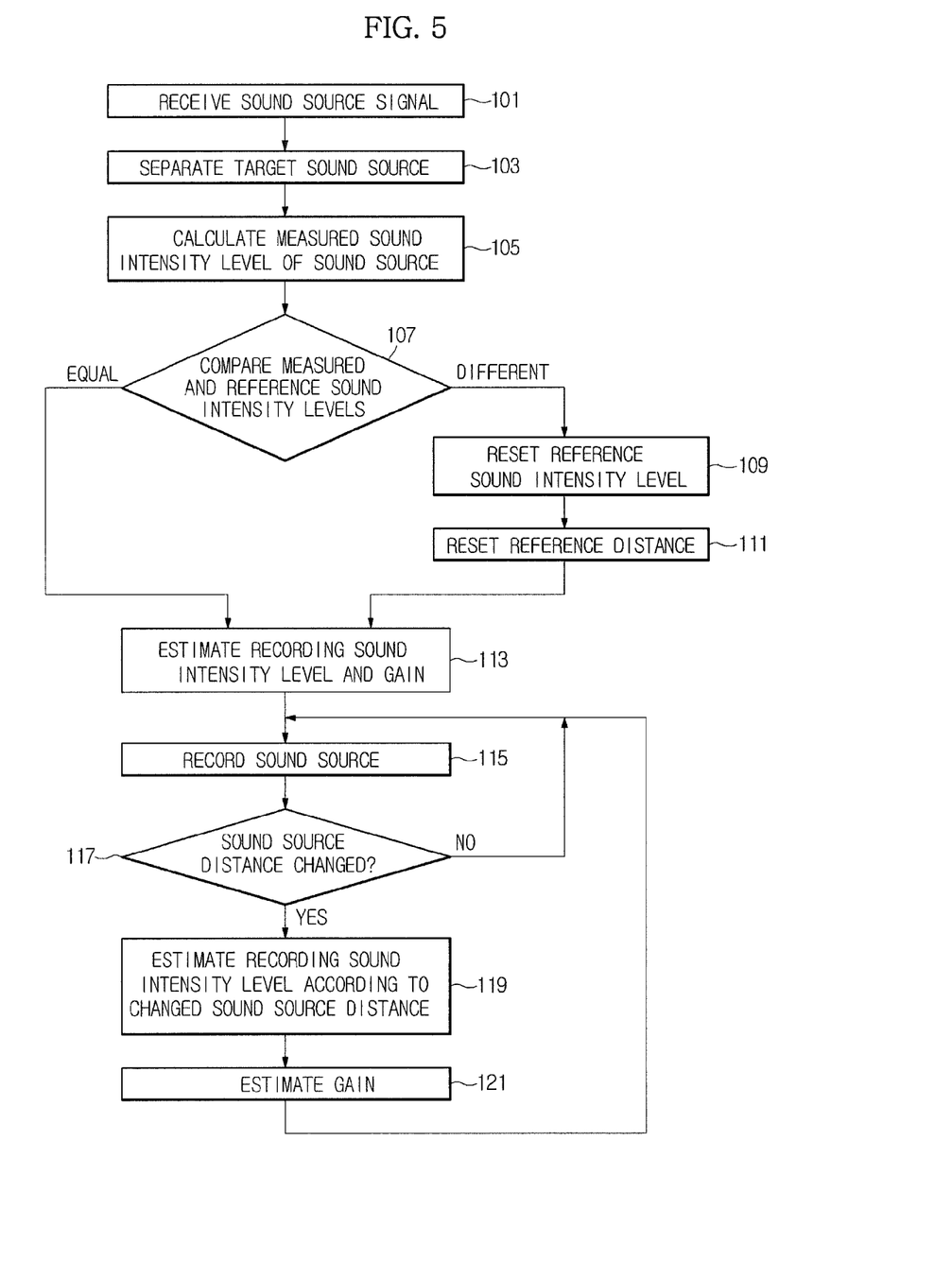
FIG. 5 is a flow chart illustrating a sound source recording method adaptable to an operating environment according to an embodiment.

FIG. 5 is a flow chart illustrating a sound source recording method adaptable to an operating environment according to an embodiment.

Although the sound source recording method is described with reference to an example in which the sound source recording apparatus 1 is implemented in a home service robot that supports household affairs, embodiments are not limited to this example and may also be applied to a device to capture moving images. In the case where a robot is present in an operating environment in which not only sound generated from a target sound source but also various other noise are present indoors or outdoors, the microphone array 11 mounted on the outer surface of the robot body receives a sound source signal including not only voice of the speaker 2 as the target sound source but also a variety of noise and the signal converter 30 then samples and provides the received signal to the controller 50 (101).

The sound source separator 51 separates a target sound source signal from the received sound source signal using one of independent component analysis (ICA) and geometric source separation (GSS) which are part of blind source separation (BSS) method (103).

The measured sound intensity level calculator 52 calculates a measured sound intensity level $L_T$ using the signal sampled by the signal converter 30 according to Expression 2 (105). The measured sound intensity level $L_T$ is compared with the reference sound intensity level $L_{ref}$ preset in the storage unit 60 (107). If the measured sound intensity level $L_T$ is different from the preset reference sound intensity level $L_{ref}$ (DIFFERNT in operation 107), the measured sound intensity level $L_T$ is stored in the storage unit 60 to reset the measured sound intensity level $L_T$ as a new reference sound intensity level $L_{ref}$ (109) and a sound source distance d that the distance measurement unit 40 has measured for the target sound source is stored in the storage unit 6 to reset the measured sound source distance d as a new reference distance $d_{ref}$ (111). A recording sound intensity level L is estimated using the reset reference sound intensity level $L_{ref}$ and reference distance $d_{ref}$ according to Expression 1.

If the measured sound intensity level $L_T$ is equal to the preset reference sound intensity level $L_{ref}$ (EQUAL in operation 107), the recording sound intensity level L is estimated using the preset reference sound intensity level $L_{ref}$ and reference distance $d_{ref}$ according to Expression 1. A gain G is then estimated according to Expression 1 (113).

The controller 50 provides a gain control signal according to the estimated gain G to the gain controller 20 to record the target sound source (i.e., the sound of the target sound source) after adjusting the intensity of the sound of the target sound source according to the gain control signal (115).

If the sound source distance d measured through the distance measurement unit 40 has not changed during recording of the sound of the target sound source (No in operation 117), recording of the sound of the target sound source is continued.

If the sound source distance d measured through the distance measurement unit 40 has changed due to movement of the speaker 2 (YES in operation 117), the recording sound intensity level L and the gain G are re-estimated according to the changed sound source distance d (119 and 121) and a gain control signal according to the re-estimated gain G is provided to the gain controller 20 to record the target sound source after appropriately adjusting the intensity of the sound of the target sound source according to the gain control signal.

The above embodiment has been described with reference to an example in which the reference sound intensity level $L_{ref}$ and reference distance $d_{ref}$ preset in the storage unit 60 are used without change or after reset. However, the embodiments are not limited to this example and, in an embodiment, a measured sound source distance and an effective sound intensity level measured through the sound source recording apparatus 1 are set as a reference distance $d_{ref}$ and a reference sound intensity level $L_{ref}$ and a recording sound intensity level L and a gain G are estimated using the reference sound intensity level $L_{ref}$ and the reference distance $d_{ref}$ to record the target sound source after adjusting the gain of each microphone according to the estimated gain. This embodiment may be implemented without adding hardware components to the sound source recording apparatus 1, which is described below with reference to FIG. 6.

Figure 6:
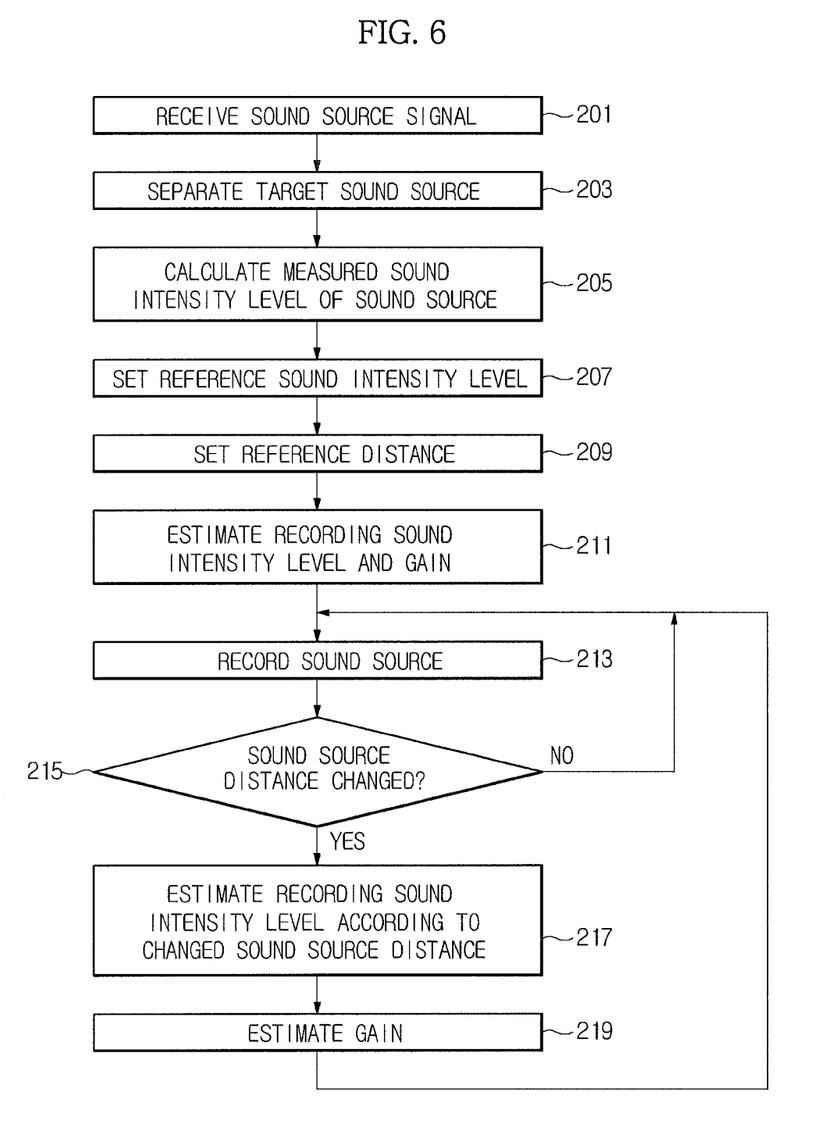
FIG. 6 is a flow chart illustrating a sound source recording method adaptable to an operating environment according to an embodiment.

FIG. 6 is a flow chart illustrating a sound source recording method adaptable to an operating environment according to an embodiment.

The microphone array 11 mounted on the outer surface of the body of the robot in which the sound source recording apparatus 1 is implemented receives a sound source signal including not only voice of the speaker 2 as the target sound source but also a variety of noise and the signal converter 30 then samples and provides the received signal to the controller 50 (201).

The sound source separator 51 separates a target sound source signal from the received sound source signal using an ICA algorithm (203) and the measured sound intensity level calculator 52 calculates a measured sound intensity level $L_T$ using the sampled signal of the target sound source according to Expression 2 (205). This measured sound intensity level $L_T$ is initially set as a reference sound intensity level $L_{ref}$ and stored in the storage unit 60 (207). In addition, a sound source distance d that the distance measurement unit 40 has measured for the target sound source is initially set as a reference distance $d_{ref}$ and stored in the storage unit 60 (209).

The recording sound intensity level estimator 54 estimates a recording sound intensity level L and a gain G using the initially set reference sound intensity level $L_{ref}$ and the initially set reference distance $d_{ref}$ according to Expression 1 (211). Here, the estimated recording sound intensity level L is equal to the measured sound intensity level $L_T$.

The controller 50 provides a gain control signal according to the estimated gain G to the gain controller 20. The gain controller 20 then records sound of the target sound source whose intensity has been adjusted by the gain controller 20 (213).

If the sound source distance d measured through the distance measurement unit 40 has not changed during recording of the sound of the target sound source (No in operation 215), recording of the sound of the target sound source is continued after adjusting the gain according to the gain estimated using the initially set reference sound intensity level $L_{ref}$ and reference distance $d_{ref}$ as before.

If the sound source distance d measured through the distance measurement unit 40 has changed due to movement of the speaker 2 (YES in operation 215), the recording sound intensity level L and the gain G are re-estimated according to the changed sound source distance d (217 and 219) and a gain control signal according to the re-estimated gain G is provided to the gain controller 20 to record the target sound source after adjusting the intensity of the sound of the target sound source according to the gain control signal.

As is apparent from the above description, according to the embodiments, it may be possible for a sound source recorder or a moving image capturing device to reproduce a sound source at a predetermined and uniform intensity and it may also be possible to increase the sound source recognition capabilities of an intelligent robot for a sound source since the sound source is recorded at a predetermined level by adaptively controlling or adjusting the gain of the microphones according to the operating environment.

Although a few embodiments have been shown and described, it would be appreciated by those skilled in the art that changes may be made in these embodiments without departing from the principles and spirit of the embodiments, the scope of which is defined in the claims and their equivalents.

What is claimed is:

1. A sound source recording method adaptable to an operating environment, the method comprising:
    separating a target sound source from a signal received through an array of microphones;
    measuring a sound intensity level of the target sound source;
    comparing the measured sound intensity level with a preset reference sound intensity level for the target sound source;
    resetting the measured sound intensity level as the reference sound intensity level if the measured sound intensity level is different from the reference sound intensity level and estimating a recording sound intensity level and a gain of the microphones using the reset reference sound intensity level; and
    adjusting gain of the microphones according to the estimated gain and recording the target sound source.

2. The sound source recording method according to claim 1, wherein the measured sound intensity level is an effective sound intensity level.

3. The sound source recording method according to claim 1, wherein, if a sound source distance of the target sound source has changed, the recording sound intensity level and the gain of the microphones are re-estimated according to the changed sound source distance.

4. The sound source recording method according to claim 1, wherein the separating the target source is a blind source separation (BSS) method.

5. The sound source recording method according to claim 4, wherein the BSS method is one of independent component analysis (ICA) and geometric source separation (GSS).

6. The sound source recording method according to claim 1, wherein the gain estimation uses Expression 1:

$$L = L_{ref} \frac{d_{ref}^2}{d^2} \quad \text{(Expression 1)}$$

$$G = B \frac{1}{L},$$

where L is an estimated recording sound intensity level, Lref is a reference sound intensity level, d is a sound source distance, dref is a reference distance, G is an estimated gain, and B is a constant.

7. The sound source recording method according to claim 1, wherein the measured sound intensity level is obtained according to Expression 2:

$$L_T = \sqrt{E\{x_i[n]^2\}}, \quad \text{(Expression 2)}$$

where LT is a measured sound intensity level, E{ } is an expected value or average, and xi[n] is a sampled value of a sound source signal xi.

8. A sound source recording method adaptable to an operating environment, the method comprising:
separating a target sound source from a signal received through an array of microphones;
measuring a sound source distance and a sound intensity level of the target sound source;
initially setting the measured sound intensity level as a reference sound intensity level and initially setting the measured sound source distance as a reference distance;
estimating a recording sound intensity level and a gain of the microphones using the initially set reference sound intensity level and reference distance; and
adjusting gain of the microphones according to the estimated gain and recording the target sound source.

9. The sound source recording method according to claim 8, wherein, if a sound source distance of the target sound source has changed, the recording sound intensity level and the gain of the microphones are re-estimated according to the changed sound source distance.

10. A sound source recording apparatus adaptable to an operating environment, the apparatus comprising:
a sound source receiver to receive a sound source signal through an array of microphones;
a gain controller to adjust gain of the microphones according to a gain control signal to control a sound intensity of the received sound source signal;
a signal converter to convert adjusted gain received from the gain controller to a digital signal and to provide the digital signal to a controller and a storage unit;
a distance measurement unit to measure a sound source distance of a target sound source; and
the controller to separate the target sound source from the received sound source signal, analyze the separated target sound source to estimate gain of the microphones, re-estimate gain of the microphones if the sound source distance measured by the distance measurement unit has changed, and provide the gain control signal according to the estimated gain of the microphones.

11. The sound source recording apparatus according to claim 10, wherein the controller includes:
a sound source separator to separate a target sound source from the received sound source signal;
a measured sound intensity level calculator to calculate the measured sound intensity level of the target sound source;
a reference level setter to reset the measured sound intensity level as a reference sound intensity level if the measured sound intensity level calculated by the measured sound intensity level calculator is different from a preset reference sound intensity level;
a recording sound intensity level estimator to estimate a recording sound intensity level using the preset reference sound intensity level or the reset reference sound intensity level; and
a gain estimator to estimate gain of the microphones using the estimated recording sound intensity level.

12. The sound source recording apparatus according to the claim 11, wherein the sound source separator uses a blind source separation (BSS) method.

13. The sound source recording apparatus according to claim 12, wherein the BSS is one of independent component analysis (ICA) and geometric source separation (GSS) belonging to a blind source separation (BSS) method.

14. The sound source recording apparatus according to claim 11, wherein the recording sound intensity level estimator and the gain estimator estimate the recording sound intensity level and the gain using Expression 1:

$$L = L_{ref}\frac{d_{ref}^2}{d^2}$$ (Expression 1)

$$G = B\frac{1}{L},$$

where L is an estimated recording sound intensity level, Lref is a reference sound intensity level, d is a sound source distance, dref is a reference distance, G is an estimated gain, and B is a constant.

15. The sound source recording apparatus according to claim 11, wherein the signal converter to sample the received sound source signal to convert the same to a digital signal,
wherein the measured sound intensity level calculator calculates an effective measured sound intensity level LT using a sampled signal of the target sound source according to Expression 2:

$$L_T = \sqrt{E\{x_i[n]^2\}},$$ (Expression 2)

where LT is a measured sound intensity level, E{ } is an expected value or average, and xi[n] is a sampled value of a sound source signal xi.

16. The sound source recording apparatus according to claim 10, wherein the controller estimates a recording sound intensity level using a reference sound intensity level and a reference distance that are initially set respectively to a sound intensity level and a sound source distance measured for the target sound source and estimates gain of the microphones using the estimated recording sound intensity level.

* * * * *